(12) United States Patent
Kim

(10) Patent No.: US 7,517,429 B2
(45) Date of Patent: Apr. 14, 2009

(54) PLASMA TREATMENT APPARATUS

(75) Inventor: Chun-Sik Kim, Sungnam (KR)

(73) Assignee: Advanced Display Process Engineering Co., Ltd., Sungnam-shi (KR)

( * ) Notice: Subject to any disclaimer, the term of this patent is extended or adjusted under 35 U.S.C. 154(b) by 0 days.

(21) Appl. No.: 11/730,595

(22) Filed: Apr. 3, 2007

(65) Prior Publication Data

US 2007/0227660 A1    Oct. 4, 2007

(30) Foreign Application Priority Data

Apr. 4, 2006    (KR) .................. 10-2006-0030540

(51) Int. Cl.
*C23F 1/00*    (2006.01)
*H01L 21/306*    (2006.01)
(52) U.S. Cl. ................................. 156/345.29
(58) Field of Classification Search ............. 156/345.29
See application file for complete search history.

(56) References Cited

U.S. PATENT DOCUMENTS 3,646,956 A * 3/1972 Rogers .................. 137/859
6,663,025 B1 * 12/2003 Jacob et al. ............... 239/554
6,672,864 B2 * 1/2004 Wang et al. ................. 432/5

FOREIGN PATENT DOCUMENTS

JP    06-216075    8/1994

* cited by examiner

*Primary Examiner*—Michael Cleveland
*Assistant Examiner*—Keath T Chen
(74) *Attorney, Agent, or Firm*—Ked & Associates, LLP

(57) ABSTRACT

The present invention relates to a plasma treatment apparatus, and more particularly, to a plasma treatment apparatus capable of supplying pressure gas while preventing flying of particles accumulated on the bottom of a chamber. The plasma treatment apparatus of the present invention comprises a chamber; an intake/exhaust portion provided to the bottom of the chamber to supply the chamber with pressure gas, the intake/exhaust portion being configured such that an inner diameter thereof is increased upwardly; and a pressure gas source connected to the intake/exhaust portion to supply the pressure gas thereto. The apparatus may further comprise a vacuum source connected to the intake/exhaust portion to exhaust the chamber.

14 Claims, 4 Drawing Sheets

PLASMA TREATMENT APPARATUS

BACKGROUND OF THE INVENTION

1. Field of the Invention

The present invention relates to a plasma treatment apparatus, and more particularly, to a plasma treatment apparatus capable of supplying pressure gas while preventing flying of particles accumulated on the bottom of a chamber.

2. Description of the Related Art

A conventional plasma treatment apparatus such as an etching apparatus, an ion injection apparatus, a sputtering apparatus or a low pressure CVD apparatus creates the interior of a process chamber into a vacuum atmosphere and conducts predetermined plasma treatment to a subject to be treated. This process camber is kept at a vacuum state when the process is performed, but should be changed to an atmospheric state and then opened when performing maintenance works. Thus, the process chamber includes an exhaust portion for exhausting the process chamber, and an intake portion for supplying pressure gas such as nitrogen into the process chamber to return the interior of the chamber to an atmospheric pressure.

Furthermore, once the interior of the process chamber is returned to the atmospheric pressure to take a subject to be treated into or out of the process chamber, the interior should be exhausted to a predetermined vacuum level for the next process, whereby it takes considerable time to perform the exhaust process.

Therefore, a load lock chamber with a small volume as compared with the process chamber is generally provided. In this case, since only the load lock chamber can be changed to an atmospheric pressure or a vacuum state, the yield of this process can be enhanced.

Accordingly, the load lock chamber should be repeatedly changed to atmospheric and vacuum environments as the subject to be treated is taken into and out of the chamber. To this end, the load lock chamber includes an exhaust portion for exhausting the interior of the chamber and an intake portion for supplying pressure gas therein.

However, reaction products generated during the plasma treatment and particles generated from a carrying or driving device generally remain within the process chamber or load lock chamber (hereinafter, referred to as 'chamber'). The particles are accumulated on the bottom of the chamber over time.

Therefore, air flow created while supplying the chamber with pressure gas to return the interior to an atmospheric pressure blows off particles accumulated in the chamber, and then, the blown particles may adhere to the subject.

In order to solve the aforementioned problem, a conventional technology has proposed an improved chamber 10 including an intake portion 20 installed through the bottom of the chamber and protruding to a certain height from the bottom of the chamber, as shown in FIG. 1. That is, an opening formed at an end of the intake portion 20 for discharging pressure gas is positioned higher than particles accumulated on the chamber bottom to prevent the particles from being blown off by the supplied pressure gas.

However, this improved conventional technology can prevent particles from being directly blown off by air flow of pressure gas during the intake process, but cannot yet prevent the particles from being flying due to viscous flow S caused when the pressure gas is supplied.

As shown in FIG. 2, the pressure gas is supplied into the chamber through the intake portion 20. At this time, viscous flow S is formed around the intake portion 20, and is simultaneously propagated along a chamber wall. It has been also determined that this viscous flow S causes particles accumulated on the chamber bottom to fly off. Further, the same phenomenon has occurred during the exhaust process.

Furthermore, the particles accumulated on the chamber bottom cannot be yet discharged.

SUMMARY OF THE INVENTION

The present invention is conceived to solve the aforementioned problems. Accordingly, an object of the present invention is to provide a plasma treatment apparatus capable of supplying pressure gas while preventing flying of particles accumulated on the bottom of a chamber.

Another object of the present invention is to provide a plasma treatment apparatus capable of discharging particles accumulated on the chamber bottom.

According to an aspect of the present invention for achieving the objects, there is provided a plasma treatment apparatus, which comprises a chamber; an intake/exhaust portion provided to the bottom of the chamber to supply the chamber with pressure gas, the intake/exhaust portion being configured such that an inner diameter thereof is increased upwardly; and a pressure gas source connected to the intake/exhaust portion to supply the pressure gas thereto. More specifically, the plasma treatment apparatus may further comprise a vacuum source connected to the intake/exhaust portion to exhaust the chamber.

Preferably, the plasma treatment apparatus may further comprise a valve for selectively connecting the intake/exhaust portion with the pressure gas source or the vacuum source. Accordingly, the intake/exhaust portion may perform any one of functions of supplying and discharging the pressure gas or both of the functions.

Further, at least one exhaust hole is preferably formed in a side of the intake/exhaust portion to discharge particles accumulated on the bottom of the chamber.

According to another aspect of the present invention, there is provided a plasma treatment apparatus, which comprises a chamber; an intake portion provided to the bottom of the chamber to supply the chamber with pressure gas and configured such that an inner diameter thereof is increased upwardly; a pressure gas source connected to the intake portion to supply the pressure gas thereto; an exhaust portion provided to the bottom of the chamber to exhaust the chamber and configured such that an inner diameter thereof is increased upwardly; and a vacuum source connected to the exhaust portion. That is, this apparatus is characterized in that the intake and exhaust portions provided to the bottom of the chamber and configured such that inner diameters thereof are increased upwardly are individually provided.

Accordingly, the exhaust hole through which particles accumulated on the bottom of the chamber are discharged may be formed only in the exhaust portion.

DESCRIPTION OF THE PREFERRED EMBODIMENT

Hereinafter, preferred embodiments of the present invention will be described in detail with reference to the accompanying drawings.

Figure 1:
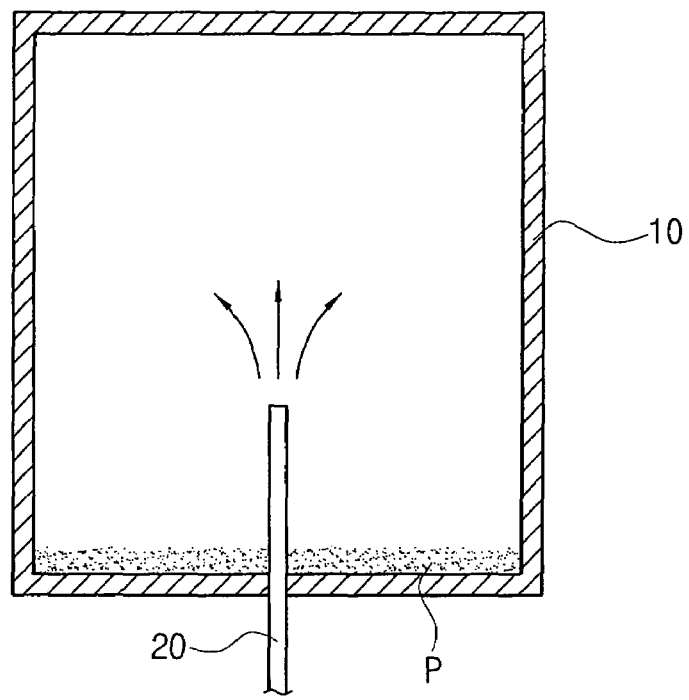
FIG. 1 is a sectional view showing a conventional plasma treatment apparatus.
Figure 2:
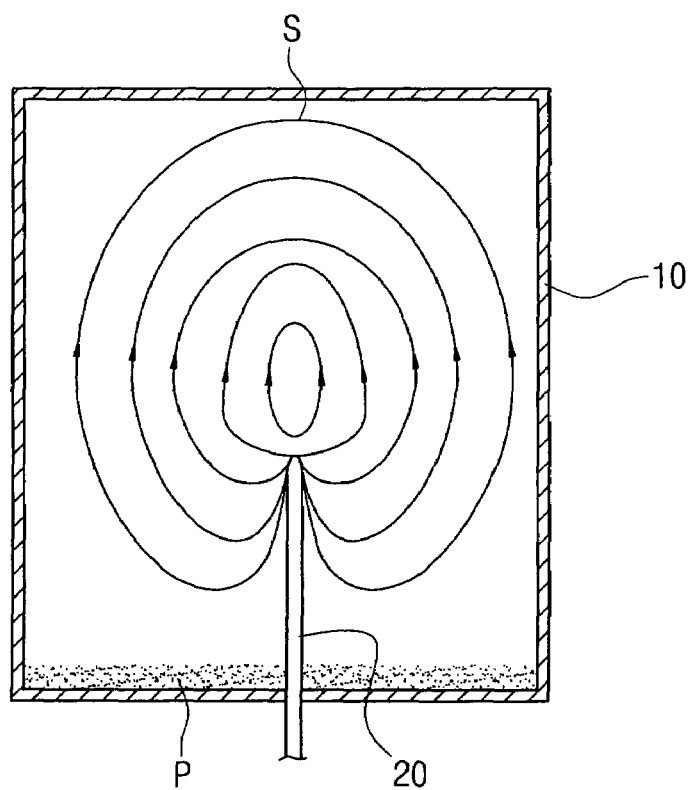
FIG. 2 is a view showing an operating state of the plasma treatment apparatus of FIG. 1.
Figure 3:
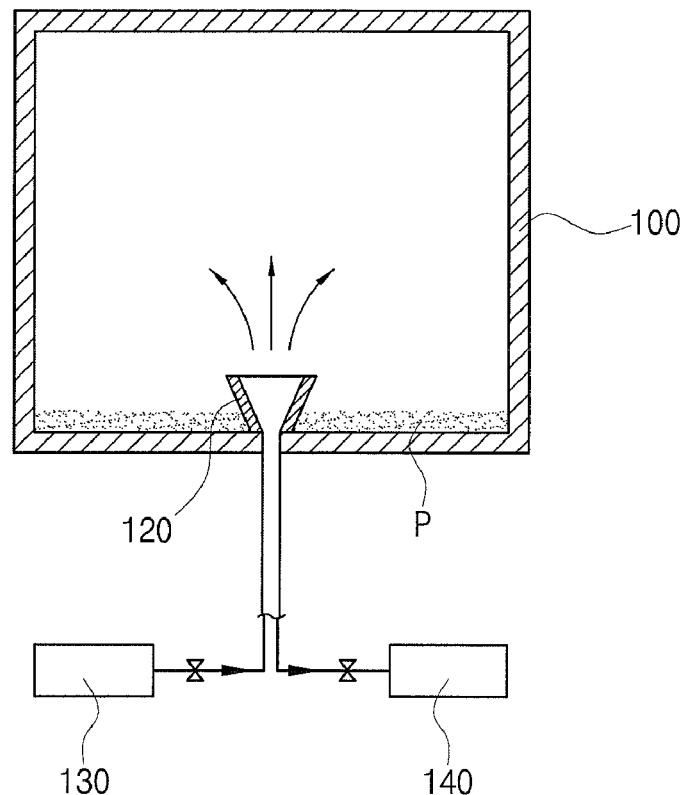
FIG. 3 is a sectional view showing a plasma treatment apparatus according to the present invention.

Referring to FIG. 3, a chamber 100 is a load lock chamber provided to one side of a process chamber in which a predetermined process is performed on a subject to be treated. Thus, the chamber 100 is repeatedly changed to atmospheric and processing (vacuum) environments.

To this end, an intake/exhaust portion 120 for supplying (sucking) pressure gas into the chamber 100 or exhausting the chamber 100 is provided. That is, the intake/exhaust portion 120 is connected to a pressure gas source 130 to supply pressure gas into the chamber 100 or is connected to a vacuum source 140 to create the chamber to a vacuum level suitable to a processing condition by exhausting the chamber 100. Thus, the intake/exhaust portion 120 includes a valve capable of selectively switching between the pressure gas source 130 and the vacuum source 140.

In addition, the intake/exhaust portion 120 includes a sidewall 120a that extends upward from the bottom surface of the chamber 100. The intake/exhaust portion 120 supplies pressure gas through an opening 121 formed at an upper end of the intake/exhaust portion. At this time, the intake/exhaust portion 120 should protrude from the bottom surface of the chamber 100 by a predetermined height such that particles P accumulated on the chamber bottom cannot fly off directly due to the supplied pressure gas. That is, the opening of the intake/exhaust portion 120 should be positioned higher than the particles P.

In this embodiment, the intake/exhaust portion 120 is configured such that its inner diameter is increased upwardly. The intake/exhaust portion 120 so configured can effectively prevent occurrence of viscous flow while the pressure gas is supplied or discharged.

Figure 4:
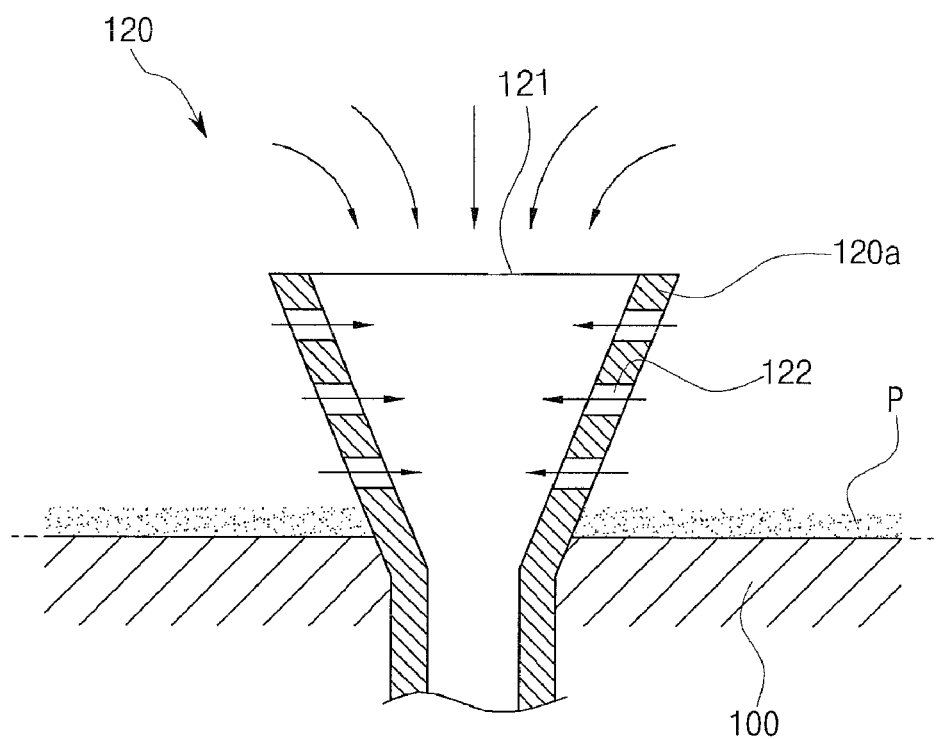
FIGS. 4 to 6 are sectional views showing various examples of an intake/exhaust portion corresponding to an essential part of the plasma treatment apparatus of FIG. 3.

Referring to FIG. 4, a plurality of exhaust holes 122 are formed in the side of the intake/exhaust portion 120 of the present invention. The exhaust holes 122 are used to discharge particles P accumulated on the bottom of the chamber 100 during the exhaust process.

More specifically, the exhaust holes 122 are formed below the opening 121, i.e. relatively near the particles P, which in turn can be effectively discharged through the exhaust holes 122.

Figure 5:
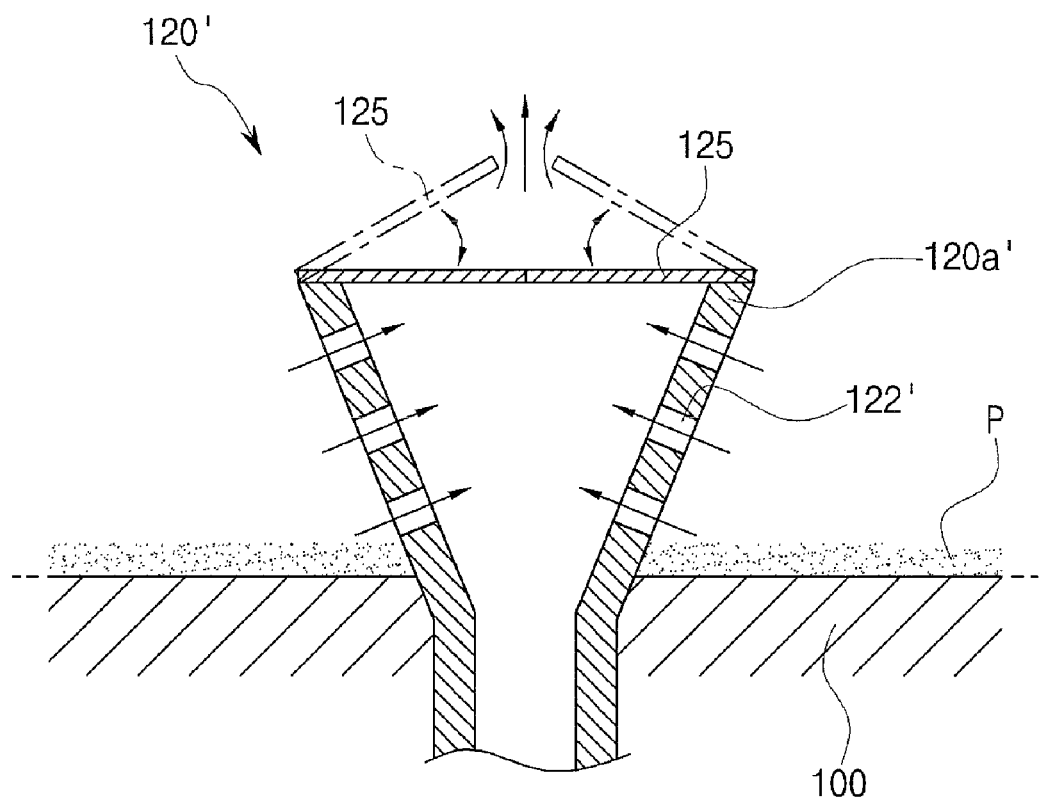

Referring to FIG. 5, it will be understood that, in an intake/exhaust portion 120' of another example, exhaust holes 122' are formed to be inclined downward toward sidewalls 120a' of the chamber 100. In this configuration, the particles P can be discharged more stably in view of air flow.

In this embodiment, it will be understood that a closing member 125 for opening or closing the opening is provided. The closing member 125 opens the opening when the pressure gas is supplied, whereas the closing member 125 closes the opening when the chamber 100 is exhausted. Of course, the closing member 125 does not always close the opening during the exhaust process.

Figure 6:
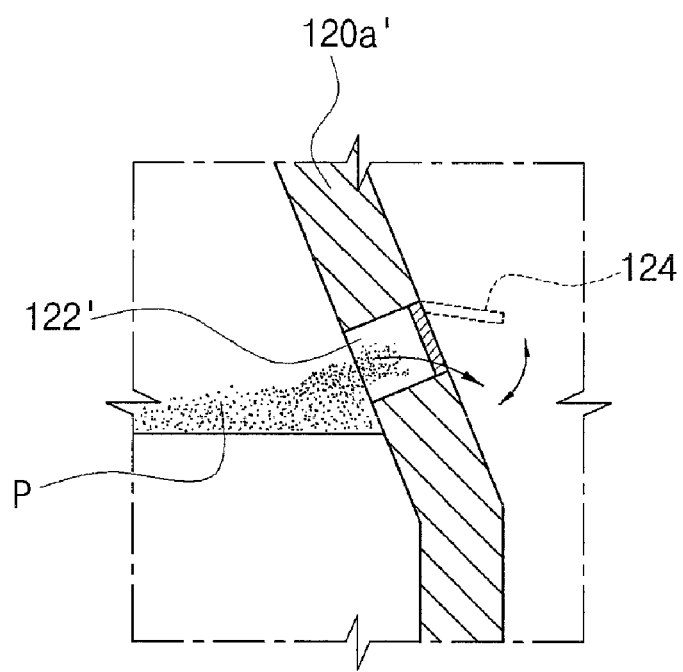

Referring to FIG. 6, it will be understood that, in a further example, a closing member 124 is also provided to each of the exhaust holes 122'. The closing member 124 is used to prevent pressure gas from being supplied through the relevant exhaust hole 122' into the chamber. That is, the exhaust holes 122' are closed during the intake process but opened during the exhaust process.

Preferably, each of the closing members 124 and 125 is shaped as a thin film and is formed into a check valve such that it can be elastically operated according to a flow direction of the pressure gas.

Figure 7:
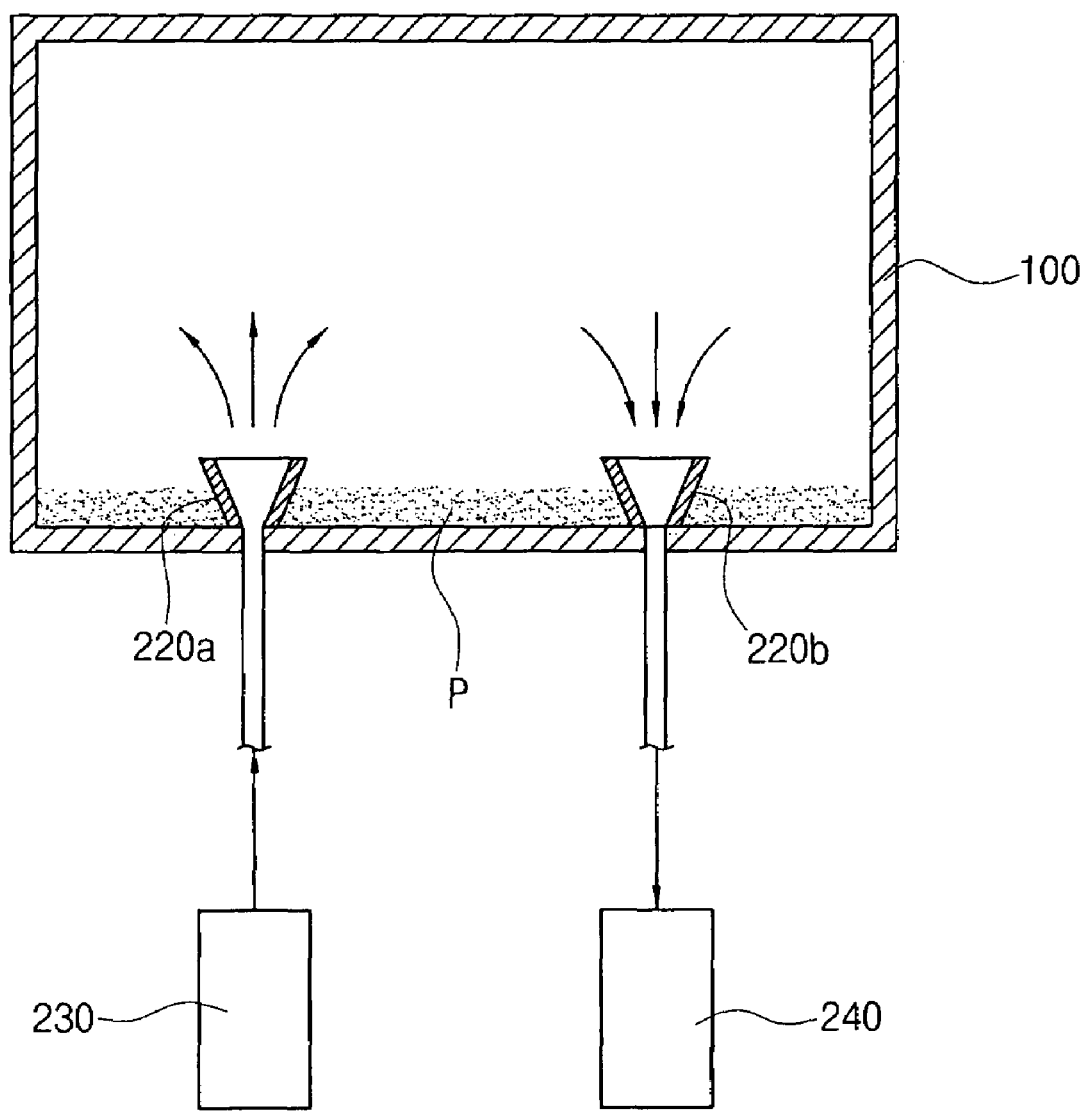
FIG. 7 shows a plasma treatment apparatus according to another embodiment of the present invention.

Referring to FIG. 7, in another embodiment, an intake portion 220a and an exhaust portion 220b are individually provided to the bottom of the chamber 100. The intake portion 220a is connected to a pressure gas source 230, and the exhaust portion 220b is connected to a vacuum source 240. It will be understood that the intake portion 220a and the exhaust portion 220b are all configured such that their inner diameters are increased upwardly. Such a configuration is to prevent occurrence of viscous flow, as described above.

Further, although not shown in the figures, it is preferred that the exhaust portion 220b is formed with the exhaust holes shown in FIGS. 4 to 6, and the closing members are also provided to open or close the exhaust holes.

Although it has been illustrated in the previous embodiment that the chamber is a load lock chamber, the present invention is not limited thereto. That is, the present invention may be applied to a process chamber in the same way.

According to the present invention, it is possible to supply pressure gas while preventing flying of particles, without any influence caused by the pressure gas and its viscous flow.

Further, it is also possible to discharge particles accumulated on the chamber bottom.

What is claimed is:

1. A plasma treatment apparatus, comprising:
    a chamber; and
    at least one of an intake or exhaust portion, comprising:
        at least one body having a wall that extends upward into an interior space of the chamber from a bottom surface of the chamber such that an outer surface of the wall is exposed to the interior space of the chamber; the wall having an inner diameter that is increased upwardly and an opening formed at an upper end of the wall; and
        at least one through hole that extends through the wall across a thickness thereof, spaced apart from the bottom surface of the chamber and the opening at the upper end of the wall, so as to discharge particles accumulated in a bottom portion of the chamber during an exhaust process.

2. The plasma treatment apparatus according to claim 1, further comprising a pressurized gas source and a vacuum source each connected to the at least one intake or exhaust portion to supply pressurized gas to and exhaust pressurized gas from the chamber, respectively.

3. The plasma treatment apparatus according to claim 2, wherein the at least one through hole is oriented at a downward incline from an inner surface to the outer surface of the wall.

4. The plasma treatment apparatus according to claim 2, further comprising a valve that selectively connects the at least one intake or exhaust portion with the pressurized gas source or the vacuum source.

5. The plasma treatment apparatus according to claim 2, wherein the at least one body comprises a single, hollow, substantially cylindrical body, and wherein the at least one through hole comprises a plurality of through holes formed at predetermined intervals in the wall of the intake or exhaust portion.

6. The plasma treatment apparatus according to claim 5, further comprising a closing member that opens and closes the opening such that the opening is open when pressurized gas is supplied to the chamber, and closed when the chamber is exhausted.

7. The plasma treatment apparatus according to claim 2, wherein the at least one body comprises:

a first hollow, substantially cylindrical body provided at the bottom surface of the chamber and connected to the pressurized gas source to supply pressurized gas to the chamber; and a second hollow, substantially cylindrical body provided at the bottom surface of the chamber, at a predetermined distance from the first body, and connected to the vacuum source to exhaust pressurized gas from the chamber, wherein the at least one through hole is formed in the second body.

8. The plasma treatment apparatus according to claim 1, further comprising at least one closing member that selectively opens or closes the opening or the at least one through hole.

9. The plasma treatment apparatus according to claim 8, wherein the at least one closing member is a check valve.

10. The plasma treatment apparatus according to claim 1, wherein the pressurized gas source supplies nitrogen (N2) to the chamber.

11. The plasma treatment apparatus according to claim 1, wherein the chamber is a process chamber or a load lock chamber.

12. A plasma treatment apparatus, comprising:
a chamber;
an intake portion provided at a bottom of the chamber to supply the chamber with pressurized gas; and
an exhaust portion provided at the bottom of the chamber, the exhaust portion comprising:
an exhaust wall that extends upward into an interior of the chamber from the bottom of the chamber such that an outer surface of the exhaust wall is exposed to the interior of the chamber; the exhaust wall having an inner diameter that is increased upwardly and an exhaust opening provided at an upper end of the exhaust wall; and
at least one exhaust hole formed in the exhaust wall, positioned between the bottom of the chamber and the exhaust opening at the upper end of the exhaust wall and extending through a thickness of the exhaust wall so as to discharge particles accumulated in a bottom portion of the chamber during an exhaust process.

13. The plasma treatment apparatus according to claim 12, further comprising:
a pressurized gas source connected to the intake portion to supply pressurized gas to the chamber; and
a vacuum source connected to the exhaust portion to exhaust the chamber.

14. The plasma treatment apparatus according to claim 12, wherein the at least one exhaust hole is oriented at a downward incline from an inner surface to the outer surface of the exhaust wall.

* * * * *